United States Patent
Hirai et al.

[11] Patent Number: 6,084,260
[45] Date of Patent: *Jul. 4, 2000

[54] SEMICONDUCTOR STORAGE DEVICE AND METHOD FOR MANUFACTURING THE SAME

[75] Inventors: Tadahiko Hirai, Fuji, Japan; Yasuo Tarui, 5-6-4, Minamizawa, Higashikurume-shi, Tokyo 203, Japan

[73] Assignees: Asahi Kasei Kogyo Kabushiki Kaisha, Osaka; Yasuo Tarui, Tokyo, both of Japan

[ * ] Notice: This patent is subject to a terminal disclaimer.

[21] Appl. No.: 08/999,005

[22] Filed: Dec. 29, 1997

Related U.S. Application Data

[63] Continuation of application No. 08/622,343, Mar. 25, 1996, Pat. No. 5,955,755.

[51] Int. Cl.[7] .................................................. H01L 29/76
[52] U.S. Cl. ........................ 257/295; 257/411; 257/324
[58] Field of Search ................................... 257/295, 406, 257/410, 411, 324

[56] References Cited

U.S. PATENT DOCUMENTS

| | | | |
|---|---|---|---|
| 4,888,733 | 12/1989 | Mobley | 365/145 |
| 5,436,481 | 7/1995 | Egawa et al. | 257/327 |
| 5,572,052 | 11/1996 | Kashihara et al. | 257/295 |
| 5,955,755 | 9/1999 | Hirai et al. | 257/295 |

FOREIGN PATENT DOCUMENTS

| | | |
|---|---|---|
| 2-113496 | 4/1990 | Japan . |
| 6-97452 | 4/1994 | Japan . |

*Primary Examiner*—Mark V. Prenty
*Attorney, Agent, or Firm*—Finnegan, Henderson, Farabow, Garrett & Dunner, L.L.P.

[57] ABSTRACT

An Si oxide film, an oriented paraelectric oxide thin film and an oriented ferroelectric thin film are laminated on an Si single crystal substrate having a region for a source and a drain. A conductor thin film is formed in a portion not covered with an insulating film. A laminated structure formed of the Si oxide film, the oriented paraelectric oxide thin film and the oriented ferroelectric thin film is used as a gate of a transistor. The Si oxide film functions as a carrier injection inhibiting layer.

8 Claims, 9 Drawing Sheets

SEMICONDUCTOR STORAGE DEVICE AND METHOD FOR MANUFACTURING THE SAME

This is a continuation of application Ser. No. 08/622,343, filed Mar. 25, 1996 now U.S. Pat. No. 5,955,755.

BACKGROUND OF THE INVENTION

1. Field of the Invention

The present invention relates to a semiconductor storage device and to a method for manufacturing the same. More particularly, the present invention relates to a nonvolatile memory in which a ferroelectric is used for a gate of a transistor so as to directly control a current flowing between a source and a drain, and to a method for manufacturing the same.

2. Description of the Related Art

Semiconductor storage devices are classified into a volatile memory capable of retaining data only when electric power is on and a nonvolatile memory capable of retaining data even when electric power is off. Examples of the volatile memory include a DRAM (Dynamic Random Access Memory) and an SRAM (Static Random Access Memory), while examples of the nonvolatile memory include a mask ROM (Mask Read Only Memory), a PROM (Programmable Read Only Memory), an EPROM (Erasable Programmable Read Only Memory), and an EEPROM (Electrically Erasable Programmable Read Only Memory).

Among these nonvolatile memories, an EPROM and an EEPROM are ROMs which can rewrite the memory contents like RAMs, and generally have an MOS-FET (MOS field-effect transistor) structure in which a floating gate is interposed between a control gate and a channel. In an EPROM, an erasing operation is performed by irradiation with ultraviolet rays so as to eject carriers from the inside of a floating gate, while a writing operation is performed by utilizing hot electrons, which are generated by application of a high voltage between a control gate and a drain and then remain inside the floating gate. In an EEPROM, an erasing operation can be carried out without irradiation with ultraviolet rays.

The above-described floating gate type MOS-FET, however, requires a time of the order of msec. and a high electric field of the order of $10^7$ V/cm for writing and erasing operations. Accordingly, unlike generally used DRAMs, an EEPROM cannot perform writing and erasing operations in the same cycle, and further, requires a power source of a high voltage.

There have been recently developed FRAMs (Ferroelectric Random Access Memories) most of which have a structure using a ferroelectric capacitor in place of the capacitor in a DRAM (see Japanese Patent Application Laying-open No. 113,496/1990). In an FRAM, writing, erasing, and reading operations involve each a polarization inversion of a ferroelectric, thus posing a problem of fatigue of the ferroelectric. Moreover, any one of these operations takes about 100 nsec. since they involve electric charging and discharging of the ferroelectric capacitor. Furthermore, it is necessary to separately dispose a transistor and a capacitor. This is disadvantageous in reducing an area of the device.

In order to solve the aforementioned problems, a semiconductor storage device having a structure in which an epitaxial oxide film and a ferroelectric thin film are laminated on a gate of a transistor has been proposed in Japanese Patent Application Laying-open No. 97,452/1994. Although a nonvolatile memory which operates at a high speed, suffers from little fatigue of a ferroelectric and is suitable for an area reduction could be provided, there arise problems from the standpoints of reproducibility and stability among various characteristics of a gate of a transistor, thus making it difficult to enhance a throughput upon manufacture. This is because it is difficult to control an interface between an Si substrate and a ferroelectric thin film and because polarization of a ferroelectric is canceled by injection of carriers from the Si substrate into the ferroelectric.

SUMMARY OF THE INVENTION

The present invention has been accomplished in an attempt to solve the above problems experienced by the prior art.

An object of the present invention is to provide a nonvolatile memory which operates at a high speed, suffers from little fatigue of a ferroelectric, is suitable for an area reduction, and particularly excellent in reproducibility and stability among various gate characteristics without any injection of carriers into the ferroelectric, and has an enhanced throughput.

According to the first aspect, the present invention provides a semiconductor storage device comprising:
   an Si single crystal substrate;
   a transistor formed on the Si single crystal substrate;
   the transistor comprising a gate having a laminated structure comprising:
      a carrier injection inhibiting layer made of an Si oxide film,
      an oriented paraelectric oxide thin film,
      an oriented ferroelectric thin film, and
      a conductor thin film sequentially laminated on the Si single crystal substrate.

Here, the Si oxide film is from 20 to 100 Å thick.

The oriented paraelectric oxide thin film may be an oriented thin film composed of at least one compound selected from the group consisting of $CeO_2$, YSZ (yttria-stabilized zirconia), ceria-stabilized zirconia, $Y_2O_3$, $ZrO_2$, MgO, $SrTiO_3$ and $MgAl_2O_4$.

The oriented ferroelectric thin film may be an oriented thin film composed of at least one compound selected from the group consisting of $PbTiO_3$, $PbZrTiO_3$, $PbLaZrTiO_3$, and $SrBi_2Ta_2O_9$.

The Si single crystal substrate may be a (100) Si single crystal substrate.

The Si single crystal substrate may be a (111) Si single crystal substrate.

The oriented paraelectric oxide thin film may be a laminated film comprising a $CeO_2$ thin film and an $SrTiO_3$ thin film.

According to the second aspect, the present invention provides a method for manufacturing a semiconductor storage device, which comprises the step of:
   forming, on an Si single crystal substrate, a laminate having a carrier injection inhibiting layer made of an Si oxide film, an oriented paraelectric oxide thin film, an oriented ferroelectric thin film, and a conductor thin film, wherein the laminate serves as a gate.

According to the third aspect, the present invention provides a method for manufacturing a semiconductor storage device, which comprises the steps of:
   forming a source and a drain in the vicinity of a surface of an Si single crystal substrate and a laminate serving as a gate on the Si single crystal substrate, the method comprising the steps of:

forming an oriented paraelectric oxide thin film on the Si single crystal substrate;

heating the Si single crystal substrate having the oriented paraelectric oxide thin film formed thereon in an oxidizing atmosphere so as to form a carrier injection inhibiting layer of an Si oxide film on an interface between the paraelectric oxide thin film and the substrate;

forming an oriented ferroelectric thin film on the paraelectric oxide thin film above the substrate having the carrier injection inhibiting layer formed thereon; and forming a conductor thin film on the ferroelectric thin film.

According to the fourth aspect of the present invention, the present invention provides a method for manufacturing a semiconductor storage device including the step of forming a source and a drain in the vicinity of the surface of an Si single crystal substrate and a laminate serving as a gate on the Si single crystal substrate, which method comprises the steps of:

forming an oriented paraelectric oxide thin film on the Si single crystal substrate;

forming an oriented ferroelectric thin film on the paraelectric oxide thin film above the substrate having a carrier injection inhibiting layer formed thereon, wherein the ferroelectric thin film is formed in an oxidizing atmosphere so as to form the carrier injection inhibiting layer formed of an Si oxide film on an interface between the paraelectric oxide thin film and the substrate; and subsequently, forming a conductor thin film on the ferroelectric thin film.

Here, the Si oxide film may be from 20 to 100 Å thick.

The oriented paraelectric oxide thin film may be an oriented thin film composed of $CeO_2$, YSZ (yttria-stabilized zirconia), ceria-stabilized zirconia, $Y_2O_3$, $ZrO_2$, MgO, $SrTiO_3$ or $MgAl_2O_4$.

The oriented ferroelectric thin film may be an oriented thin film composed of $PbTiO_3$, PZT ($PbZrTiO_3$), PLZT ($PbLaZrTiO_3$) and $SrBi_2Ta_2O_9$.

The Si single crystal substrate may be a (100) Si single crystal substrate.

The Si single crystal substrate may be a (111) Si single crystal substrate.

The oriented paraelectric oxide thin film may be a laminated film formed of a $CeO_2$ thin film and an $SrTiO_3$ thin film.

The semiconductor storage device according to the present invention has a laminated structure in which an Si oxide film, an oriented paraelectric oxide thin film, an oriented ferroelectric thin film, and a conductor thin film are laminated sequentially on an Si substrate, although the films do not necessarily have to be laminated sequentially.

According to the present invention, by the term "an oriented paraelectric oxide thin film" is meant a paraelectric oxide thin film in which specific crystallographic axes of paraelectric crystals are arranged acutely perpendicularly to a main surface of the substrate. By the term "an oriented ferroelectric thin film" is meant a ferroelectric thin film in which specific crystallographic axes of ferroelectric crystals are arranged acutely perpendicularly to a main surface of the substrate. It is preferable that crystallographic axes, which cause polarization most strongly, be acutely perpendicular to the substrate. The crystalline arrangements can be confirmed by high energy electron diffractometry, X-ray diffractometry, or the like. The expression "arranged acutely perpendicularly" as used herein means the state where specific crystallographic axes are arranged at an angle of about 20° or less, more preferably, at an angle of 2° or less, with respect to an axis perpendicular to the main surface of the substrate.

As the paraelectric oxide thin film are used thin films composed of $CeO_2$, YSZ (yttria-stabilized zirconia) or ceria-stabilized zirconia, $Y_2O_3$, $ZrO_2$, MgO, $SrTiO_3$, and $MgAl_2O_4$. Among them, a $CeO_2$ thin film is much preferable from the standpoints of its electric characteristics and the orientation performance of a ferroelectric to be provided on the paraelectric oxide thin film. These paraelectric oxide thin films are formed by vacuum evaporation, laser ablation or the like.

The paraelectric oxide thin film is preferably from 100 to 500 Å thick and more preferably, from 150 to 250 Å thick. If the thickness of the paraelectric oxide thin film is less than 100 Å, a leak current becomes large, while if the thickness of the paraelectric oxide thin film exceeds 500 Å, a voltage tends to be difficult to readily apply to the ferroelectric. Accordingly, the above-described range is used preferably.

Furthermore, as the paraelectric oxide thin film, there may be used a laminated film formed of two or more kinds of paraelectric oxide thin films, for example, an $SrTiO_3$ thin film and a $CeO_2$ thin film. The $SrTiO_3$ thin film is preferred as it can effectively enhance the orientation performance of the $CeO_2$ thin film and that of the ferroelectric thin film as well. Alternatively, there may be used as the paraelectric oxide thin film a laminated film formed of two or more kinds of paraelectric oxide thin films having different degrees of oxidation one from another. For example, a $CeO_2$ thin film and a $CeO_x$ (x is other than 2) thin film may be laminated one on another. The aforementioned paraelectric oxide thin films must make an oriented growth on the Si substrate so that the ferroelectric to be provided thereon can be oriented and must also have favorable electric characteristics so as to be feasible as a gate oxide film for an FET.

As the ferroelectric thin film can be used thin films composed of $PbTiO_3$, PZT ($PbZrTiO_3$), PLZT ($PbLaZrTiO_3$), and $SrBi_2Ta_2O_9$, respectively. The ferroelectric thin film can be formed by metal organic chemical vapor deposition (MOCVD), laser ablation, sputtering, a sol-gel method, or the like. The ferroelectric thin film is preferably from 500 to 3,000 Å thick and more preferably, from 800 to 1,500 Å thick. If the ferroelectric thin film is less than 500 Å thick, leak current tends to be too large, while if it has a thickness which exceeds 3,000 Å, it is often the case that an electric field is difficult to apply to the ferroelectric. Consequently, the above-described range is used preferably.

In the case of a $CeO_2$ thin film, a (110)-face tends to be dominantly oriented on a (100) Si single crystal substrate, and further, a (001)-face of the ferroelectric thin film, having a high polarization strength, is dominantly oriented on the (110)-face of the $CeO_2$ thin film. Also, in the case of the $CeO_2$ thin film, a (111)-face tends to be dominantly oriented on a (111) Si single crystal substrate, and further, a (111)-face of the ferroelectric thin film tends to be dominantly oriented on the (111)-face of the $CeO_2$ thin film. Although the (111)-face of the ferroelectric thin film is not a plane along which the polarization strength of the ferroelectric thin film is highest, the (111)-face of the $CeO_2$ thin film is also useful since it has a feature that a film can be formed at low temperatures, e.g., as low as about 400° C.

The oriented paraelectric oxide thin film interposed between the Si single crystal substrate and the ferroelectric thin film is required for preventing the deterioration of the ferroelectric due to mutual diffusion of the components of the Si single crystal substrate and the oriented ferroelectric thin film to form an Si oxide film.

The Si oxide film is formed by a heat treatment in an oxidizing atmosphere. The Si oxide film, which serves as a carrier injection inhibiting layer, is not only important for preventing cancellation of polarization of the ferroelectric thin film due to injection of carriers from the Si substrate, but also indispensable for a stable turn-on or -off of a current flowing between a source and a drain, for enhancing a throughput, and for a stable operation of the device. The carrier injection inhibiting layer made of the Si oxide film is generally from 20 to 300 Å thick, and preferably from 20 to 100 Å thick. This thickness range is favorable for the interface between the Si single crystal and the oriented ferroelectric thin film to exhibit excellent electric characteristics so that the movement of the carriers between the Si single crystal substrate and the oriented ferroelectric thin film is prevented, with the result that the polarization of the ferroelectric is not deteriorated and that the operation voltage of a device is maintained at low levels. More particularly, the Si oxide film may be formed by a heat treatment in an oxidizing atmosphere after formation of the paraelectric oxide thin film, or by exposure in an oxidizing atmosphere for a long period during formation of the oriented ferroelectric thin film.

Examples of the conductor thin film include thin films composed of polycrystalline silicon (or polysilicon) having diffused therein one or more impurities such as boron, phosphorus and arsenic to have enhanced conductivities, metal thin films composed of Al, Cu, Au, Ir and the like, respectively, and conductive oxide thin films. The conductor thin film functions as a gate electrode such as an Al electrode. The conductor thin film can be formed by, for example, vacuum evaporation.

In the laminated structure according to the present invention, the Si oxide film, the oriented paraelectric oxide thin film, the oriented ferroelectric thin film, and the conductor thin film are sequentially laminated in this order on the Si substrate, although the films do not necessarily have to be laminated sequentially.

The substrate used in the present invention is an Si single crystal substrate, which is necessary for orienting the paraelectric oxide thin film and the ferroelectric thin film to be provided on the substrate. For achieving a stable polarization in the ferroelectric thin film, the Si single crystal substrate is preferred to have a (100)- or (111)-face.

A current flowing between the source and the drain can be turned on or off by reversing spontaneous polarization of the ferroelectric by the provision of the gate electrode according to the present invention. In order to reverse spontaneous polarization of the ferroelectric, it is necessary to apply a voltage between the substrate and the gate, between the drain and the gate, or between the source and the gate. Spontaneous polarization of the ferroelectric is reversed at a very high rate, thus achieving rewriting and erasing speeds higher than those in a DRAM. Moreover, it is a great advantage that the area of the device can be reduced without separately providing capacitors in addition to transistors.

Other and further objects, features and advantages of the present invention will become more apparent from the following description of preferred embodiments with reference to the accompanying drawings.

BRIEF DESCRIPTION OF THE DRAWINGS

The present invention will be understood more fully from the detailed description given hereinafter and from the accompanying drawings of the preferred embodiment of the invention, which, however, should not be taken to be limitative to the present invention, but are for explanation and understanding only.

In the drawings:

FIGS. 2A to 2E are cross sectional views showing semiconductor substrates, respectively, at various steps of a manufacturing method for manufacturing a semiconductor storage device according to an embodiment of the present invention;

FIGS. 3A and 3B are cross sectional views showing substrates at various steps of a method for manufacturing a semiconductor storage device according to another embodiment of the present invention;

FIGS. 4A to 4E are cross sectional views showing structures, respectively, of a semiconductor storage device according to an embodiment of the present invention at various steps of a method for manufacturing therefor;

DESCRIPTION OF THE PREFERRED EMBODIMENT

Hereinafter, preferred embodiments of a semiconductor storage device and a method for manufacturing the same according to the present invention will be described hereinafter with reference to the accompanying drawings.

Figure 1:
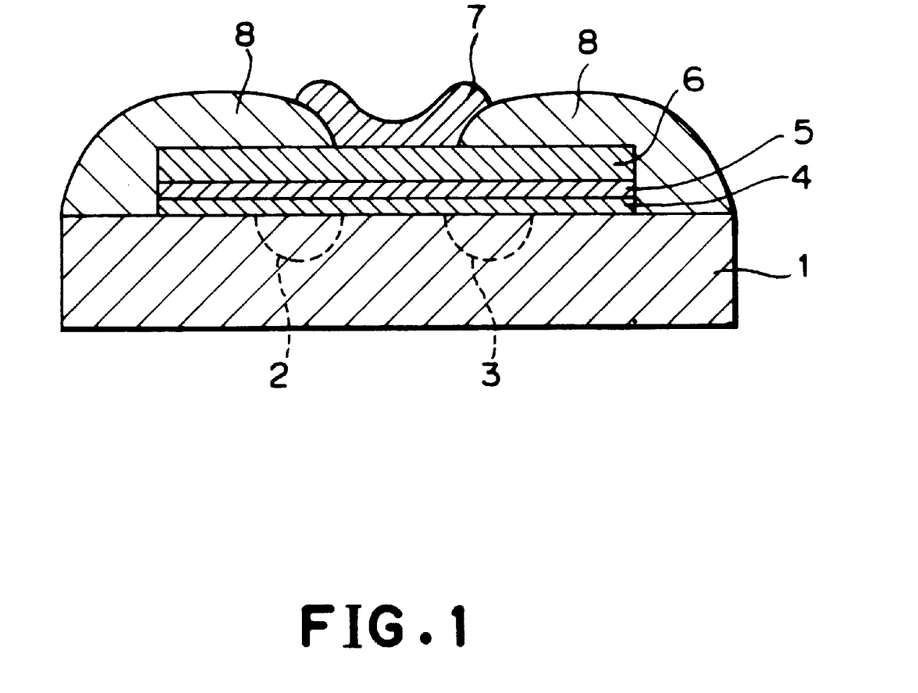
FIG. 1 is a schematic cross sectional view showing a basic structure of a semiconductor storage device in accordance with the present invention.

FIG. 1 is a schematic cross sectional view showing a semiconductor storage device according to an embodiment of the present invention. The present invention comprises a semiconductor storage device in which an Si oxide film 4 is formed on an Si single crystal substrate 1 having a source 2 and a drain 3; a paraelectric oxide thin film 5 is formed on the Si oxide film 4; and a ferroelectric thin film 6 is formed on the paraelectric oxide thin film 5 and further, a conductor thin film 7 composed of, e.g., Al as an electrode is provided on the ferroelectric thin film 6. Reference numeral 8 denotes an insulating film.

FIGS. 2A to 2E are cross sectional views together illustrating a typical method for manufacturing a semiconductor storage device of the present invention.

Figure 2A:
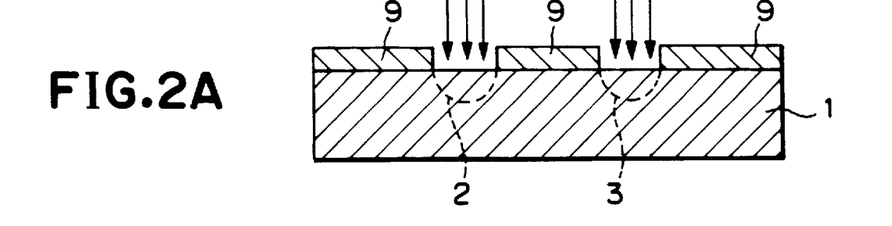
FIG. 2A illustrates a step in which each of regions of a source and a drain are formed.

1) First, as shown in FIG. 2A, conductive (for example, p-type) portions of a conductivity type opposite to that of a substrate are formed on, e.g., an n-type Si single crystal substrate 1 by using a silicon oxide 9, by doping an impurity by, e.g., an ion implantation process so as to make a source 2 and a drain 3.

Figure 2B:
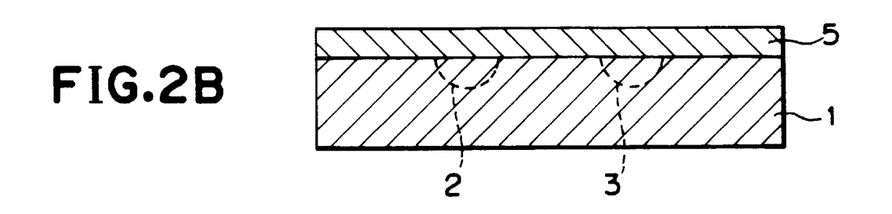
FIG. 2B illustrates a step in which a paraelectric oxide thin film is formed.
Figure 2C:
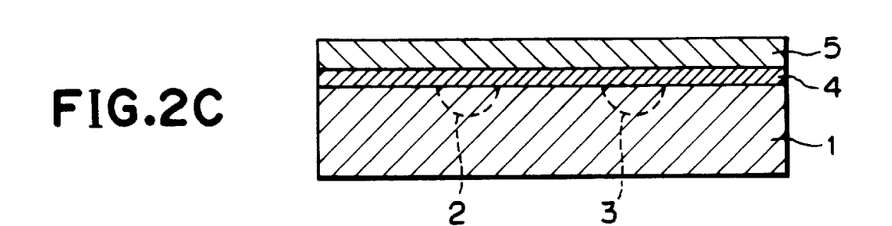
FIG. 2C illustrates a step in which an Si oxide is formed on the interface between the substrate and the paraelectric oxide thin film.
Figure 2D:
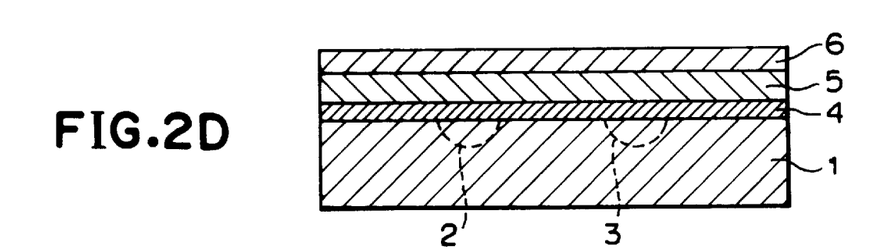
FIG. 2D illustrates a step in which a ferroelectric thin film is formed.

2) Next, the silicon oxide 9 is removed and a paraelectric oxide thin film 5 is formed on the entire upper surface of the substrate 1 by a vacuum evaporation process (FIG. 2B). In this case, the film thickness is from 150 to 200 Å (Angstrom) (from 15 to 20 nm).

3) Moreover, an Si oxide film 4 (SiO$_2$ thin film) is formed by heating the substrate 1 having the paraelectric oxide thin film 5 in the oxidizing atmosphere (FIG. 2C) under the heating conditions of at a temperature of from 650 to 750° C. for from 5 to 20 minutes in an oxidizing atmosphere to form a thin film with a thickness of from 20 to 80 Å (from 2 to 8 nm).

4) Next, a ferroelectric thin film 6 is formed on the paraelectric oxide thin film 5 by, e.g., an MOCVD method (FIG. 2D) to obtain a thick film with a thickness of from 800 to 1000 Å (from 80 to 100 nm).

Figure 2E:
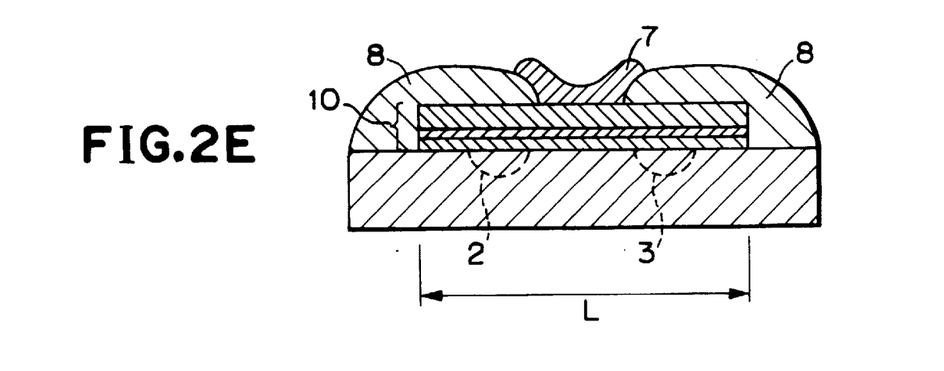
FIG. 2E illustrates a step in which a conductor thin film is formed.

5) Subsequently, by etching using a photoresist, the width of a laminate 10 consisting of the Si oxide film 4, the paraelectric oxide thin film 5 and the ferroelectric thin film 6 is adjusted to a predetermined width L which is suitable to construct a transistor, and then, a portion which should make a gate electrode is coated with a photoresist to form an insulating film on the surface other than the gate electrode portion, and the photoresist is removed to form a conductor thin film 7 composed of, e.g., an Al at the gate electrode portion. The conductor thin film is from 2,000 to 3,000 Å (from 200 to 300 nm) thick.

Here, the above-described step 3) may be omitted and the step 4) may be replaced by a step 4a) in which the Si oxide film is formed by exposing the ferroelectric thin film in an oxidizing atmosphere for a relatively long time as long as, e.g., from 1 to 2 hours in forming an oriented ferroelectric thin film by an MOCVD method.

Figure 3A:
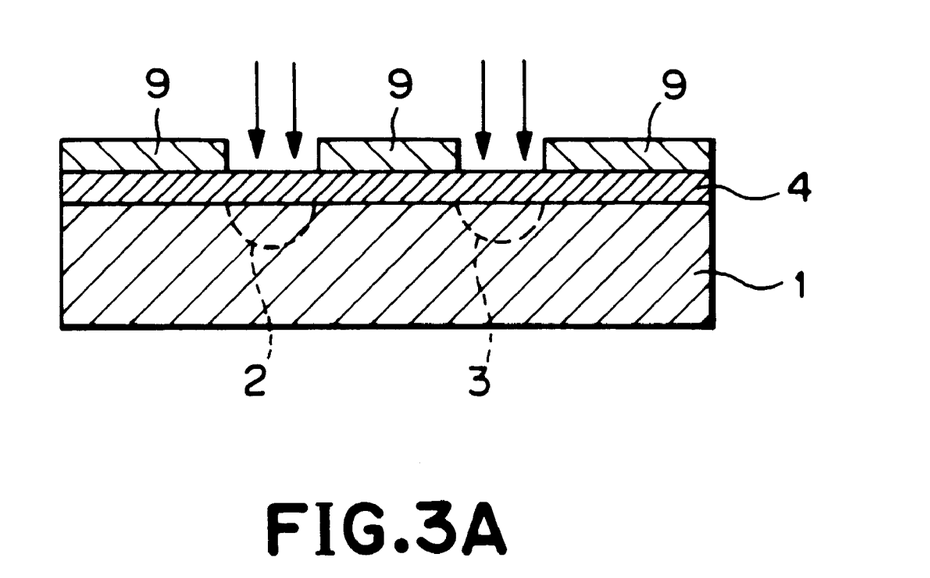
FIG. 3A illustrates a step in which each regions of a source and a drain are formed by doping an impurity through the Si oxide film.
Figure 3B:
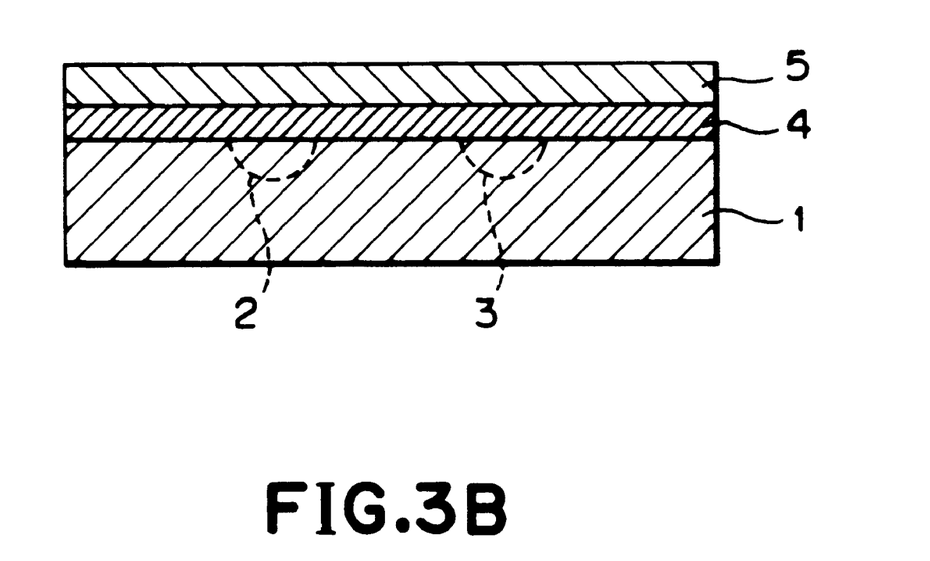
FIG. 3B illustrates a step in which a paraelectric oxide thin film is formed.

Alternatively, instead of the steps 1), 2), and 3) described above, the following steps may be performed. As shown in FIG. 3A, first, an Si oxide film 4 is formed on the surface of the substrate 1 by a thermal oxidation process, and then, conductive portions of a conductivity type opposite to that of a substrate 1 are formed by using a photoresist 9 by doping an impurity so as to make a source 2 and a drain 3. Thereafter, the photoresist 9 is removed, and as shown in FIG. 3B, a paraelectric oxide thin film 5 is formed on the Si oxide film 4, followed by the same steps as the steps shown in FIGS. 2D and 2E.

Hereinafter, the present invention will be described in greater detail by specific embodiments. However, the present invention should not be considered as being limited thereto.

Embodiment 1

Figure 4A:
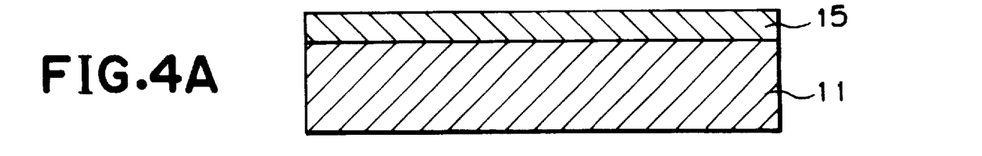
FIG. 4A illustrates a structure in which a $CeO_2$ thin film is formed on the substrate is

As shown in FIG. 4A, first, an n-type single crystal (100)-Si substrate 11 with a resistivity of 2 Ω cm which is used as a substrate is heated in the vacuum of 1×10$^{-6}$ Torr up to approximately 900° C. Subsequently, a CeO$_2$ tablet is heated with electron beams, and an approximately 150 Å thick CeO$_2$ thin film 15 was formed on the Si substrate 11 by a vacuum evaporation process. When the surface of the CeO$_2$ thin film 15 was observed by RHEED (Reflection High Energy Electron Diffraction Method), several dot patterns were observed, which confirmed growth of an <110>-oriented substantially epitaxial film.

Figure 4B:
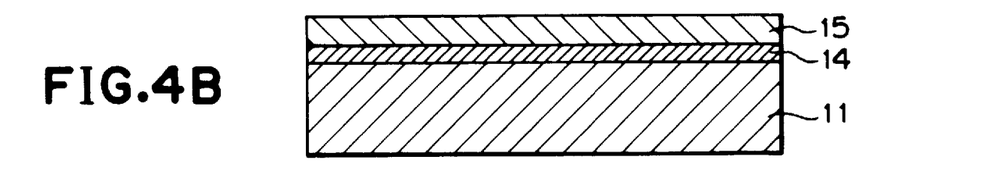
FIG. 4B illustrates a structure in which an $SiO_2$ carrier injection inhibiting layer is formed on the interface between the substrate and the $CeO_2$ thin film.
Figures 4C, 4D:
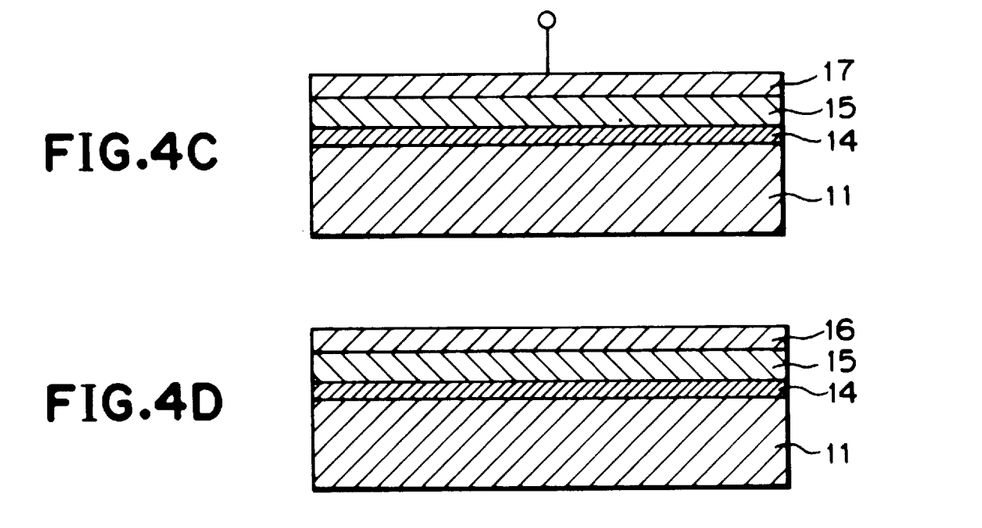
FIG. 4C illustrates a structure in which an Al electrode is directly formed on the $CeO_2$ thin film.
FIG. 4D illustrates a structure in which a $PbTiO_3$ thin film is formed on the $CeO_2$ thin film.
Figure 5:
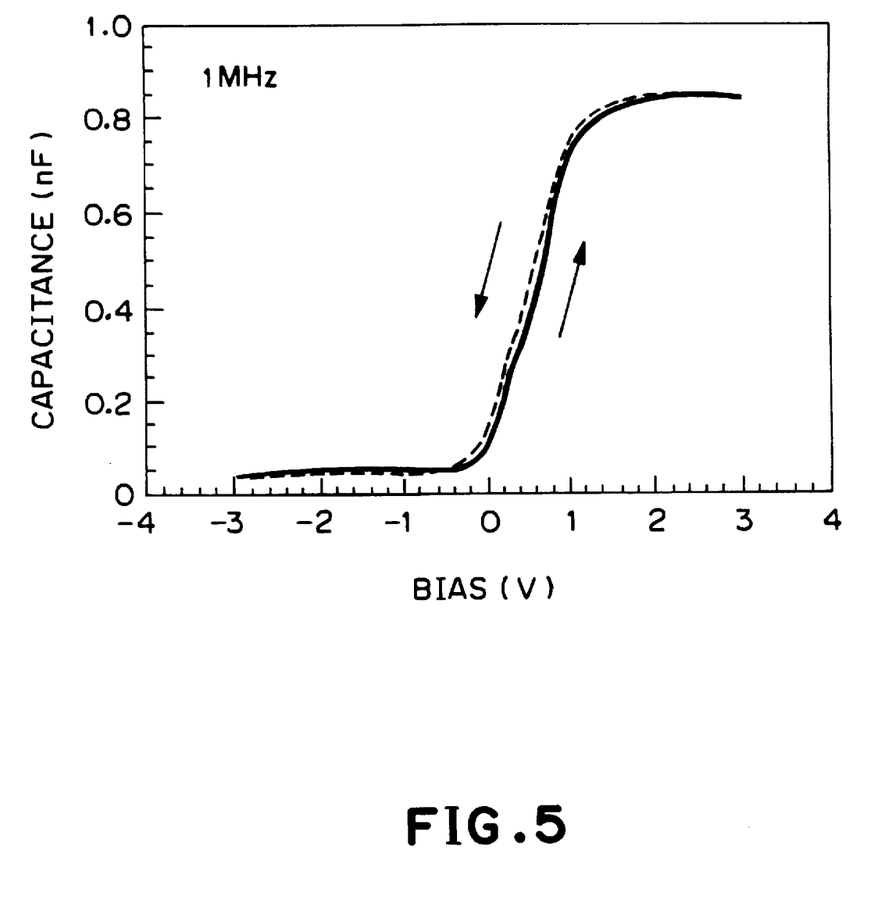
FIG. 5 is a graph illustrating capacitance vs. voltage (C-V) characteristic as measured on a sample in which $CeO_2$ is deposited on a (100)-Si substrate by vacuum evaporation and heated in an oxygen atmosphere, and an Al electrode is formed thereon by the vacuum evaporation.

Next, an SiO$_2$ carrier injection inhibiting layer 14 (corresponding to the Si oxide film 4 shown in FIG. 1) of approximately 40 Å thick was formed on an interface between an Si substrate 11 (corresponding to the substrate 1 shown in FIG. 1) and a CeO$_2$ thin film 15 (corresponding to the paraelectric oxide thin film 5 shown in FIG. 1) by heating at 900° C. for five minutes in one barometric pressure dry oxygen atmosphere (FIG. 4B). An Al electrode 17 (corresponding to the conductor thin film 7 shown in FIG. 1) was formed on the surface of the CeO$_2$ thin film 15 by the vacuum evaporation to obtain a structure as shown in FIG. 4C. By using this electrode, the capacitance vs. voltage (C-V) characteristic was measured. Results are illustrated in FIG. 5. Here, an electrostatic capacitance directly rises with an increase of an applied voltage up to the applied voltage of 1 V approximately, as illustrated by a solid line, saturates at an applied voltage of approximately 2.2 V, whereas, the electrostatic capacitance drops with a decrease of the applied voltage, following almost the same path reversibly as illustrated by a dotted line, so that the electrostatic capacitance does not substantially change with the applied negative voltage.

Figure 6:
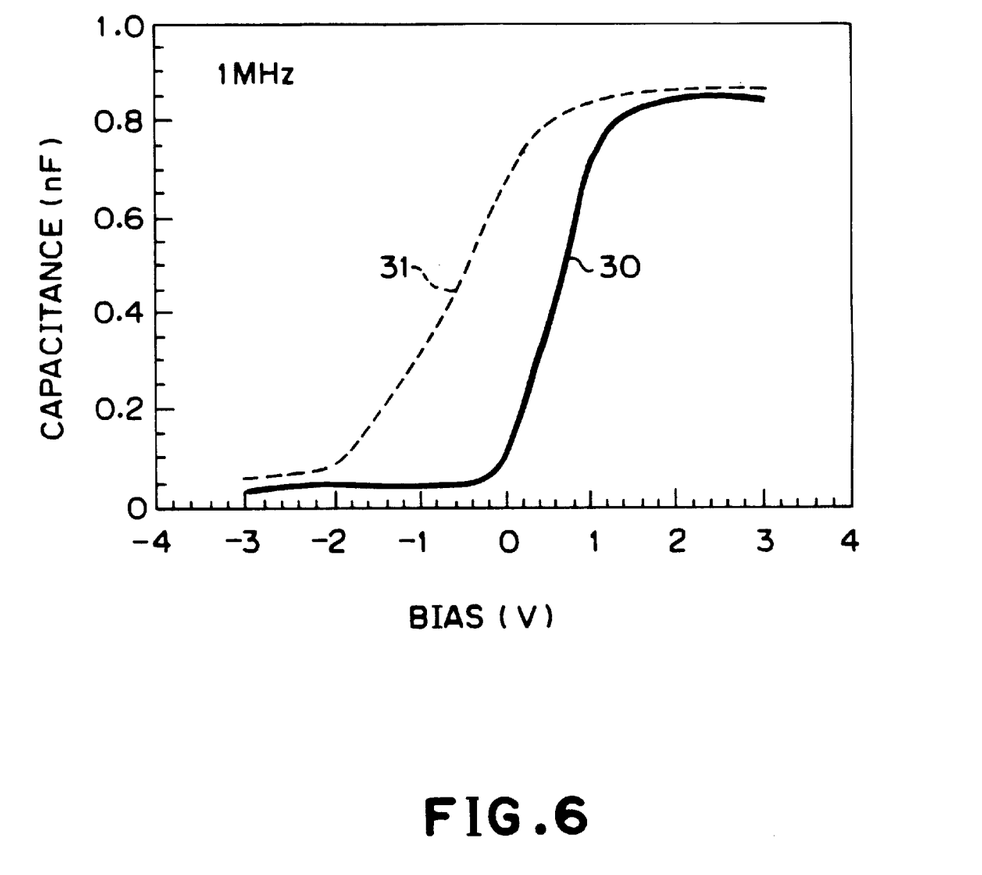
FIG. 6 is a graph illustrating capacitance vs. voltage (C-V) characteristic as measured on a sample in which $CeO_2$ is deposited on an (100)-Si substrate by vacuum evaporation and heated in an oxygen atmosphere, and an Al electrode is formed thereon by the vacuum evaporation.

Therefore, it can be proved that excellent C-V characteristics are obtained, and the CeO$_2$ thin film can be used as a gate oxide film. With respect to the characteristics, as illustrated by a curve 30 in FIG. 6 (in the case where the above described oxidation operation is performed), the interface state is improved from 10$^{13}$/cm$^2$·eV to 10$^{11}$/cm$^2$·eV, compared with a curve 31 (in the case in which the above described oxidation operation is not performed). The interface state is used as a parameter for electrically evaluating the disorder of crystallinity of an interface below the gate and can be estimated based on the gradient of the C-V characteristic curve. If the interface state is of a value below the order of 10$^{11}$/cm$^2$·eV, it can be interpreted as a good interface.

Figure 7:
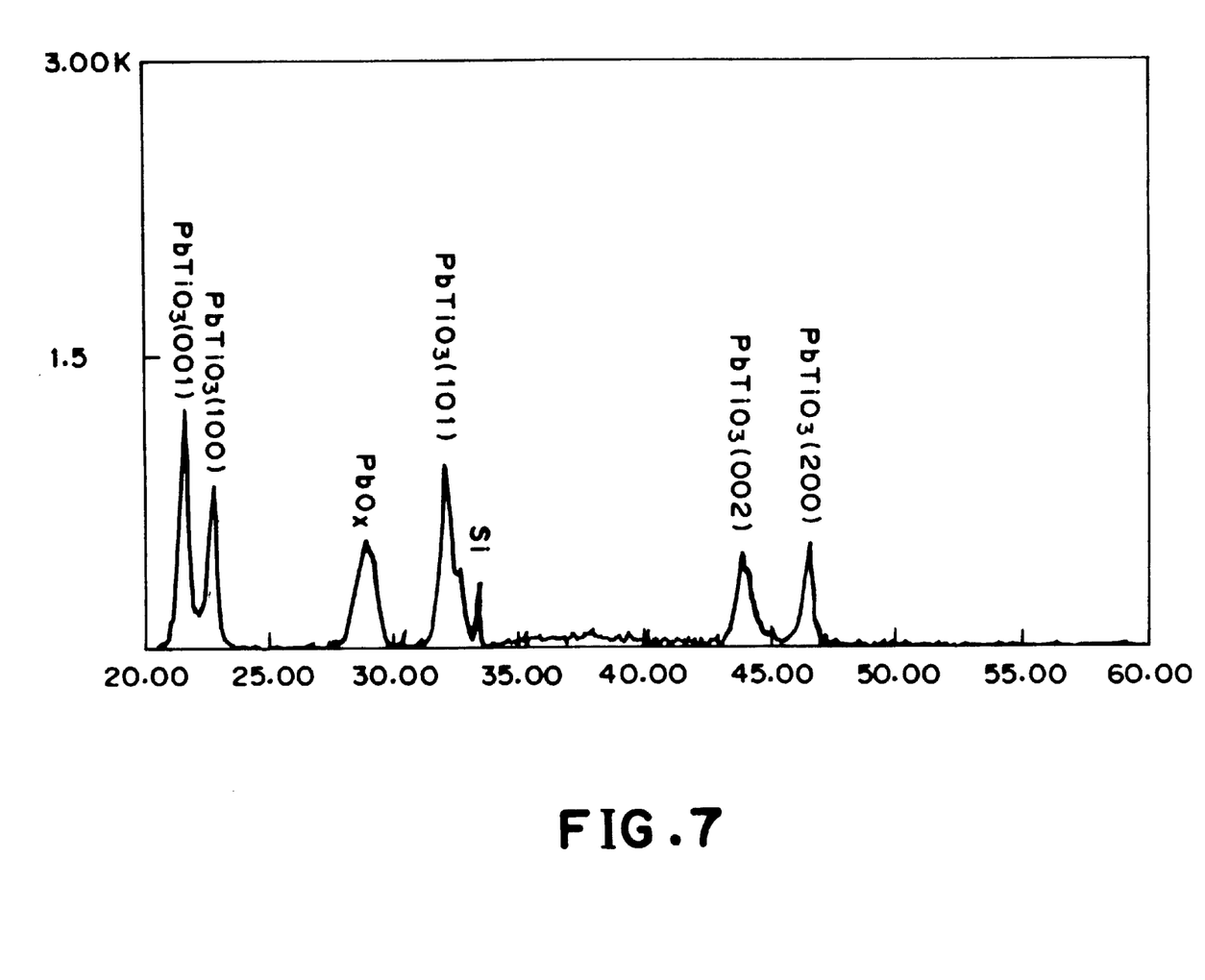
FIG. 7 is a graph illustrating the result obtained by analyzing by using X-ray diffractometry system a sample in which $CeO_2$ is deposited on a (100)-Si substrate by vacuum evaporation and a $PbTiO_3$ thin film is formed thereon by a CVD method.

Furthermore, a PbTiO$_3$ thin film 16 was formed on the (100)-CeO$_2$/SiO$_2$/Si structure of FIG. 4B by an MOCVD method (FIG. 4D). More specifically, Pb(C$_2$H$_5$)$_4$ and Ti(i-OC$_3$H$_7$)$_4$, which were used as materials, were kept at temperatures of 0° C. and 30° C., respectively. They were carried by an $N_2$ carrier gas at flow rates of 7 cc/min. and 4.5 cc/min., respectively, and sprayed onto the structure consisting of the (100)-$CeO_2$/$SiO_2$/Si substrate having a substrate temperature of 540° C. together with $O_2$ at a flow rate of 30 cc/min. to form the $PbTiO_3$ thin film 16. The atmosphere pressure was approximately 1 Torr. Moreover, the film is approximately 1000 Å thick. When the thin film is analyzed by using an X-ray diffractometry system, it was confirmed that it was strongly oriented along (100)- or (001)-$PbTiO_3$ planes (FIG. 7).

Figure 8:
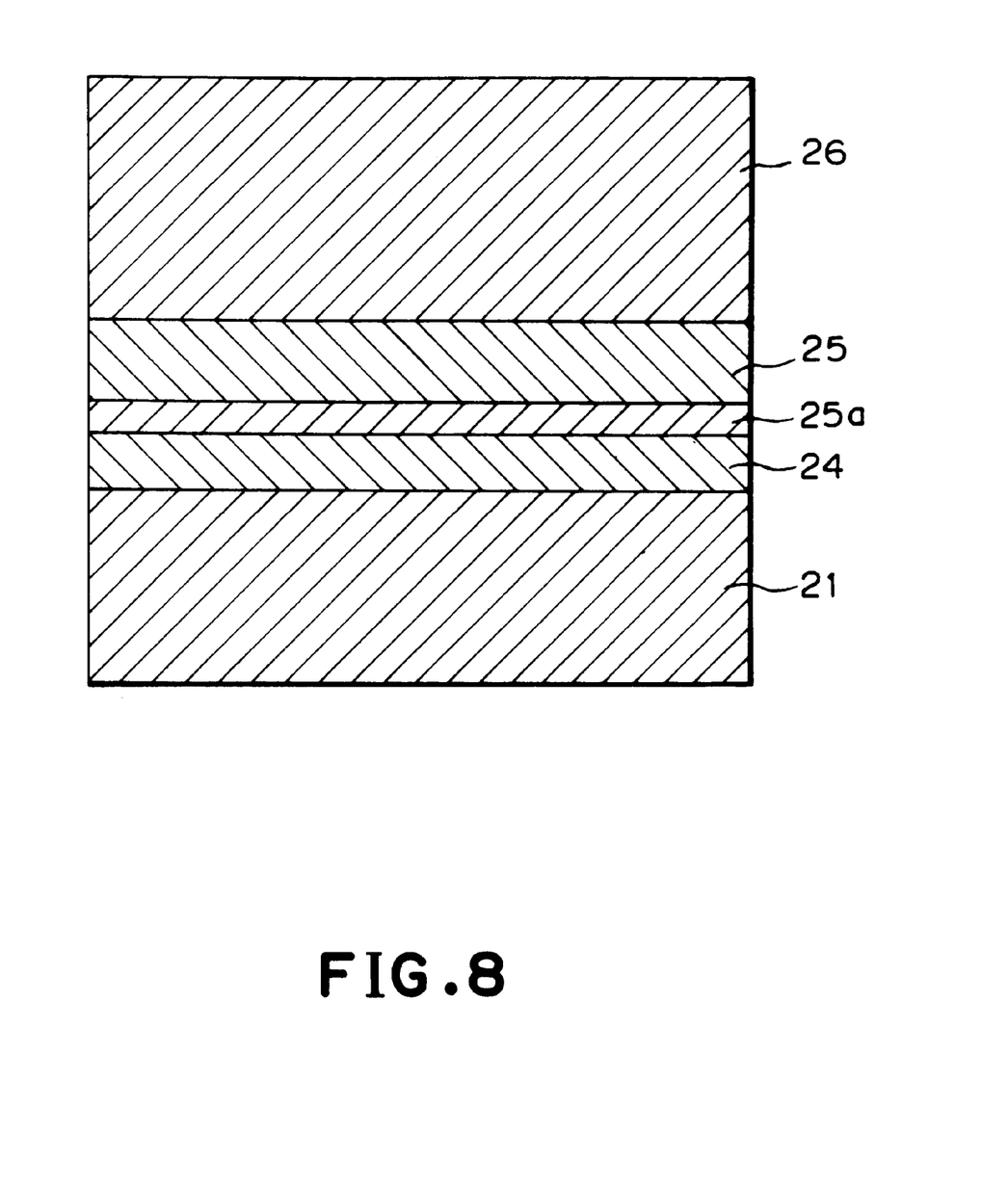
FIG. 8 is a diagram schematically illustrating a result obtained by observing a cross sectional structure of the (100)-PbTiO$_3$/CeO$_2$/SiO$_2$/Si sample by using a transmission electron microscope.

When a section of this sample was observed by using a transmission electron microscope (TEM), as schematically shown in FIG. 8, it was confirmed that a (100)-$PbTiO_3$/$CeO_2$/$SiO_2$/Si laminated structure was formed. More specifically, this laminated structure includes a (100)-Si substrate 21, an Si oxide film ($SiO_2$ thin film) 24, a $CeO_x$ film 25a, a $CeO_2$ thin film 25, and a $PbTiO_3$ thin film 26 which are successively laminated in this order. A value for "x" of the $CeO_x$ thin film 25a is: x=1.5–2. This layer is a transient layer so that a lattice mismatch is relaxed.

Figure 4E:
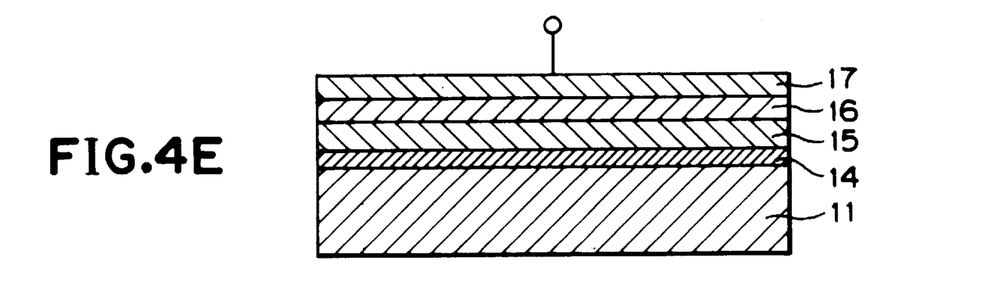
FIG. 4E illustrates a structure in which the Al electrode is formed on the $PbTiO_3$ thin film of 4(D)
Figure 9:
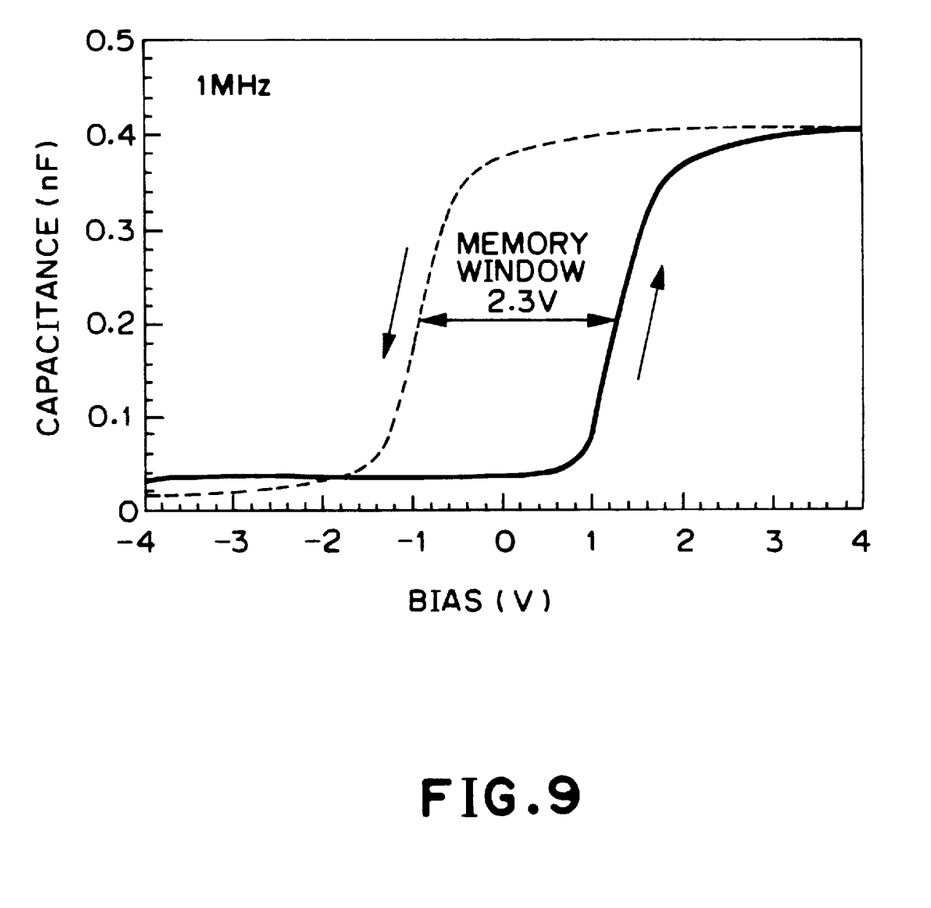
FIG. 9 is a graph illustrating capacitance vs. voltage (C-V) characteristic as measured on a sample in which an Al electrode is formed on the surface of a (100)-PbTiO$_3$/CeO$_2$/SiO$_2$/Si sample by the vacuum evaporation.

Furthermore, an aluminum electrode 17 was formed on a surface of this sample by vacuum deposition (FIG. 4E), and the capacitance vs. voltage (C-V) characteristic was measured. As a result, a hysteresis characteristic (memory-window width 2.3 V) depending on the sweeping direction (variation of voltage) as shown in FIG. 9 was observed, and memory behaviors were confirmed. A bias voltage is swept from −3 V to +3 V. Here, the capacitance in the center portion of the memory-window was measured, and thereafter, its change with time was observed. By performing this process, the memory retention time of this sample can be measured. As a result, the capacitance decreased by 20% or more in approximately 27 hours in the case where a carrier injection inhibiting layer was not particularly formed, whereas a decrease in capacitance was not observed even after one month in the case that a carrier injection inhibiting layer was formed as described above.

Furthermore, the above-mentioned $PbTiO_3$/$CeO_2$/$SiO_2$ was formed between the source and the drain, and the Al electrode was provided to attempt control of turning-on and -off of the current flowing between the source and the drain by using the self-polarization of $PbTiO_3$ in order to confirm the occurrence of the phenomenon.

Embodiment 2

First, an n-type single crystal (100)-Si substrate with a resistivity of 2 Ω cm used as a substrate was heated in a vacuum of 1×10⁻⁶ Torr up to approximately 900° C. Subsequently, a $CeO_2$ tablet was heated with electron beams, and an approximately 150 Å thick $CeO_2$ thin film was formed on the Si substrate by a vacuum evaporation. When the surface of the $CeO_2$ thin film was observed by RHEED, several dot patterns was observed, and thus, it was confirmed that there was a growth of an <110>-oriented substantially epitaxial film.

Next, an approximately 40 Å thick $SiO_2$ thin film was formed on an interface between an Si substrate and a $CeO_2$ thin film by heating at 900° C. for five minutes in a 1 atm dry oxygen atmosphere. An Al electrode was formed on the surface of the $CeO_2$ thin film by a vacuum evaporation and by using this electrode, the capacitance vs. voltage (C-V) characteristic was measured. Therefore, it was proved that excellent capacitance vs. voltage (C-V) characteristic was obtained, and the $CeO_2$ thin film was feasible as a gate oxide film. With respect to this characteristic, an interface state was improved from $10^{13}$/cm²·eV to $10^{11}$/cm²·eV, compared with the case in which the oxidation operation was not performed.

Furthermore, a $PbTiO_3$ thin film was formed on the (100)-$CeO_2$/$SiO_2$/Si by a MOCVD method. More specifically, $Pb(C_2H_5)_4$ and $Zr(t-OC_5H_9)_4$, and $Ti(i-OC_3H_7)_4$, which were used as starting materials, were kept at temperatures of 0° C., 30° C., and 30° C., respectively. They were carried by an $N_2$ carrier gas at flow rates of 7 cc/min., 5 cc/min., and 4.5 cc/min., respectively, and sprayed onto the (100)-$CeO_2$/$SiO_2$/Si substrate having the substrate temperature of 540° C. together with $O_2$ at a flow rate of 30 cc/min. to form the $PbTiO_3$ thin film. The atmosphere pressure was approximately 1 Torr. Moreover, the film thickness was approximately 1000 Å. When the thin film was analyzed by using an X-ray diffractometry system, it was confirmed that it was strongly oriented along (100)-, (001)-$PbZrTiO_3$ planes (FIG. 7).

When a section of this sample was observed by using transmission electron microscopy, as shown in FIG. 8, it was confirmed that $PbZrTiO_3$/$CeO_2$/$SiO_2$/Si laminated structure was formed.

Furthermore, the $PbZrTiO_3$/$CeO_2$/$SiO_2$ was formed between the source and the drain to attempt control of turning-on and -off of the current flowing between the source and the drain by using the self-polarization of $PbZrTiO_3$ in order to confirm the occurrence of the phenomenon.

Embodiment 3

First, an n-type single crystal (100)-Si substrate with a resistivity of 2 Ω cm used as a substrate was heated in a vacuum of 1×10⁻⁶ Torr up to approximately 900° C. Subsequently, a $CeO_2$ tablet was heated with electron beams, and an approximately 150 Å thick $CeO_2$ thin film was formed on the Si substrate by a vacuum evaporation. When the surface of the $CeO_2$ thin film was observed by RHEED, several streak patterns were observed, it was confirmed that there was a growth of a <110>-oriented substantially epitaxial film.

Next, an approximately 40 Å thick $SiO_2$ thin film was formed on an interface between an Si substrate and a $CeO_2$ thin film by heating at 900° C. for five minutes in a 1 atm dry oxygen atmosphere. An Al electrode was formed on the surface of the $CeO_2$ thin film by a vacuum evaporation and by using this electrode, the capacitance vs. voltage (C-V) characteristic was measured. Therefore, it was proved that excellent capacitance vs. voltage (C-V) characteristic was obtained, and the $CeO_2$ thin film was feasible as a gate oxide film. With respect to this characteristic, the interface state was improved from $10^{13}$/cm²·eV to $10^{11}$/cm²·eV, compared with the case in which the oxidation operation was not performed.

Furthermore, a $PbTiO_3$ thin film was formed on the (100)-$CeO_2$/$SiO_2$/Si by an MOCVD method. More specifically, $Pb(C_2H_5)_4$ and $Ti(i-OC_3H_7)_4$, which were used as starting materials, were kept at temperatures of 0° C. and 30° C., respectively. They were carried by an $N_2$ carrier gas at flow rates of 7 cc/min. and 4.5 cc/min., respectively, and sprayed onto the (100)-$CeO_2$/$SiO_2$/Si substrate having a substrate temperature of 540° C. together with $O_2$ at a flow rate of 30 cc/min. to form the $PbTiO_3$ thin film. The atmosphere pressure was approximately 1 Torr. Moreover, the film thickness was approximately 1000 Å. When the thin film was analyzed by using an X-ray diffractometry system, it was confirmed that it was strongly oriented on (100)- or (001)-$PbTiO_3$ planes.

When a section of this sample was observed by using transmission electron microscopy, it was confirmed that $PbZrTiO_3$/$CeO_2$/$SiO_2$/Si laminated structure was formed. An aluminum electrode was formed on this sampled planes by a vacuum deposition, the capacitance vs. voltage (C-V)

characteristic was measured, so that a hysteresis characteristic (memory-window) depending on the sweeping direction as shown in FIG. 9 was observed, and memory behaviors were confirmed.

Furthermore, the $PbTiO_3/CeO_2/SiO_2$ was formed between the source and the drain, and the A1 electrode was provided to attempt control of turning-on and -off of the current flowing between the source and the drain by using the self-polarization of $PbTiO_3$ in order to confirm the occurrence of the phenomenon.

Embodiment 4

First, an n-type single crystal (111)-Si substrate with a resistivity of 2 Ω cm used as a substrate is heated in a vacuum of $1\times10^{-6}$ Torr up to approximately 700° C. Subsequently, a $CeO_2$ tablet was heated with electron beams, and an approximately 150 Å thick $CeO_2$ thin film was formed on the Si substrate by a vacuum evaporation. When the surface of the $CeO_2$ thin film was observed by RHEED, several streak patterns were observed, and thus, it was confirmed that there was a growth of a <111>-oriented epitaxial film.

Next, an approximately 40 Å thick $SiO_2$ thin film was formed on an interface between an Si substrate and a $CeO_2$ thin film by heating at 900° C. for five minutes in 1 atm dry oxygen atmosphere. An A1 electrode was formed on the surface of the $CeO_2$ thin film by using this electrode, the capacitance vs. voltage (C-V) characteristic was measured. Therefore, it was proved that excellent capacitance vs. voltage (C-V) characteristic was obtained, and the $CeO_2$ thin film was feasible as a gate oxide film. With respect to this characteristic, an interface state was improved from $10^{13}/cm^2 \cdot eV$ to $10^{11}/cm^2 \cdot eV$, compared with the case in which the oxidation operation was not performed.

Furthermore, a $PbTiO_3$ thin film was formed on the (111)-$CeO_2/SiO_2/Si$ by the MOCVD method. More specifically, $Pb(C_2H_5)_4$ and $Ti(i-OC_3H_7)_4$ which were used as materials, were kept at temperatures of 0° C. and 30° C., respectively. They were carried by an $N_2$ carrier gas at flow rates of 7 cc/min. and 4.5 cc/min., respectively, and sprayed onto the (100)-$CeO_2/SiO_2/Si$ substrate having a substrate temperature of 540° C. together with $O_2$ at a flow rate of 30 cc/min. to form the $PbTiO_3$ thin film. The atmosphere pressure was approximately 1 Torr. Moreover, the film was approximately 1000 Å thick. When the thin film was analyzed by using an X-ray diffractometry system, it was confirmed that it was strongly oriented along (111)-$PbTiO_3$ planes.

An aluminum electrode was formed on this sampled surface by a vacuum deposition, the capacitance vs. voltage (C-V) characteristic was measured, so that a hysteresis characteristic (memory-window width 2.3 V) depending on the sweeping direction as shown in FIG. 9 was observed, and memory behaviors were confirmed.

Furthermore, the $PbTiO_3/CeO_2/SiO_2$ was formed between the source and the drain to attempt control of turning-on and -off of the current flowing between the source and the drain by using the self-polarization of $PbTiO_3$ in order to confirm the occurrence of the phenomenon.

Embodiment 5

First, an n-type single crystal (100)-Si substrate with a resistivity of 2 Ω cm used as a substrate was heated in a vacuum of $1\times10^{-6}$ Torr up to approximately 900° C. Subsequently, a $CeO_2$ tablet was heated with electron beams, and an approximately 140 Å thick $Ceo_2$ thin film was formed on the Si substrate by a vacuum evaporation. When the surface of the $CeO_2$ thin film was observed by RHEED, several streak patterns were observed, and thus, it was confirmed that there was a growth of a <110>-oriented substantially epitaxial film.

Furthermore, a $PbTiO_3$ thin film was formed on the (100)-$CeO_2/SiO_2/Si$ by a MOCVD method. More specifically, $Pb(C_2H_5)_4$, and $Ti(i-OC_3H_7)_4$ which were used as starting materials, were kept at temperatures of 0° C. and 30° C., respectively. They were carried by an $N_2$ carrier gas at flow rates of 7 cc/min. and 4.5 cc/min., respectively, and sprayed onto the (100)-$Ceo_2/SiO_2/Si$ substrate having a substrate temperature of 540° C., and followed by alternatingly providing $O_2$ of 30 cc/min. together with $Pb(C_2H_5)_4$ and $Ti(i-OC_3H_7)_4$ materials for approximately 5 hours to form the $PbTiO_3$ thin film. Hence, while forming the ferroelectric thin film, an approximately 30 Å thick $SiO_2$ thin film was simultaneously formed between a $CeO_2$ thin film and an Si single crystal substrate. Therefore, the interface state was lowered from $10^{13}/cm^2 \cdot eV$ by more than one digit. The atmosphere pressure was approximately 1 Torr. Moreover, the film was approximately 1000 Å thick. When the thin film was analyzed by using an X-ray diffractometry system, it was confirmed that it was strongly oriented on (100)- or (001)-$PbTiO_3$ planes.

Furthermore, the $PbTiO_3/CeO_2/SiO_2$ was formed between the source and the drain to attempt control of turning-on and -off of the current flowing between the source and the drain by using the self-polarization of $PbTiO_3$ in order to confirm the occurrence of the phenomenon.

Embodiment 6

First, an n-type single crystal (100)-Si substrate with a resistivity of 2 Ω cm used as a substrate was heated in a vacuum of $1\times10^{-6}$ Torr up to approximately 900° C. Subsequently, a $CeO_2$ tablet was heated with electron beams, and an approximately 160 Å thick $CeO_2$ thin film was formed on the Si substrate by a vacuum evaporation. When the surface of the $CeO_2$ thin film was observed by RHEED, several streak patterns were observed, and thus, it was confirmed that there was a growth of an <110>-oriented substantially epitaxial film.

Next, an approximately 40 Å thick $SiO_2$ thin film of was formed on an interface between an Si substrate and a $CeO_2$ thin film by heating at 900° C. for five minutes in 1 atm dry oxygen atmosphere. An A1 electrode was formed on the surface of the $CeO_2$ thin film by using this electrode, the capacitance vs. voltage (C-V) characteristic was measured. Therefore, it was proved that excellent capacitance vs. voltage (C-V) characteristic was measured, and the $CeO_2$ thin film were feasible as a gate oxide film. With respect to this characteristic, the interface state was improved from $10^{13}/cm^2 \cdot eV$ to $10^{11}/cm^2 \cdot eV$, compared with the case in which the oxidation operation was not performed.

Furthermore, a $PbTiO_3$ thin film was formed on the (100)-$CeO_2/SiO_2/Si$ by an MOCVD method. More specifically, $Pb(C_2H_5)_4$ and $Ti(i-OC_3H_7)_4$ used as starting materials, were kept at temperatures of 0° C. and 30° C., respectively. They were carried by an $N_2$ carrier gas at flow rates of 7 cc/min. and 4.5 cc/min., respectively, and sprayed onto the (100)-$CeO_2/SiO_2/Si$ substrate having a substrate temperature of 540° C. together with $O_2$ of 30 cc/min. to form the $PbTiO_3$ thin film. The atmosphere pressure was approximately 1 Torr. Moreover, the film was approximately 1000 Å thick. When the thin film was analyzed by using an X-ray diffractometry system, it was confirmed that it was strongly oriented on (100)- or (001)-$PbTiO_3$ planes.

An aluminum electrode was formed on this sampled surface by the vacuum deposition, the capacitance vs. voltage (C-V) characteristic was measured, so that a hysteresis characteristic (memory-window width 2.3 V) depending on the sweeping direction as shown in FIG. 9 was observed, and memory behaviors were confirmed.

Furthermore, the $PbTiO_3/CeO_2/SiO_2$ was formed between the source and the drain to attempt control of turning-on and -off of the current flowing between the source and the drain by using the self-polarization of $PbTiO_3$ in order to confirm the occurrence of the phenomenon.

The result above described will be shown in Table 1 and Table 2 below.

the ferroelectric can be largely reduced since a reading operation does not involve an inversion of spontaneous polarization and an area reduction can be achieved because it is unnecessary to provide capacitors in regions other than the transistors. Furthermore, the carrier injection inhibiting layer made of the Si oxide film is formed on the interface by heat treatment after formation of the $CeO_2$ film, so as to attain interface control, which was difficult conventionally, thus inhibiting injection of the carriers from the substrate

TABLE 1

| EMBODI- EMBODI | SUBSTRATE ORIENTATION | SUBSTRATE TEMPERATURE | SURFACE PROPERTY OF $CeO_2$ THIN FILM | FILM THICKNESS OF $CeO_2$ THIN FILM (Å) | ORIENTA- TION OF $CeO_2$ | HEAT OXIDIZING TREATMENT | FILM THICKNESS $SiO_2$ (Å) |
|---|---|---|---|---|---|---|---|
| 1 | (100) | ca. 900° C. | dotted pattern | ca. 150 | (110) | 1 atm in $O_2$, 900° C., 5 minutes | ca. 40 |
| 2 | (100) | ca. 900° C. | dotted pattern | ca. 150 | (110) | 1 atm in $O_2$, 900° C., 5 minutes | ca. 40 |
| 3 | (100) | ca. 900° C. | streak pattern | ca. 150 | (110) | 1 atm in $O_2$, 900° C., 5 minutes | ca. 40 |
| 4 | (111) | ca. 700° C. | streak pattern | ca. 150 | (111) | 1 atm in $O_2$, 900° C., 5 minutes | ca. 40 |
| 5 | (100) | ca. 900° C. | streak pattern | ca. 140 | (110) |  | ca. 30 |
| 6 | (100) | ca. 900° C. | streak pattern | ca. 160 | (110) | 1 atm in $O_2$, 900° C., 9 minutes | ca. 90 |

TABLE 2

| | | STARTING MATERIAL GAS | | | |
|---|---|---|---|---|---|
| EMBODI- MENT | FERRO- ELECTRIC | KIND | TEMPERA- TURE (° C.) | FLOW RATE (CC/MIN.) | MANNER |
| 1 | $PbTiO_3$ | $Pb(C_2H_5)_4$ | 0 | 7 | |
| | | $Ti(i-OC_3H_7)_4$ | 30 | 4.5 | |
| 2 | $PbZrTiO_3$ | $Pb(C_2H_5)_4$ | 0 | 7 | |
| | | $Zr(t-OC_5H_9)_4$ | 30 | 5 | |
| | | $Ti(i-OC_3H_7)_4$ | 30 | 4.5 | |
| 3 | $PbTiO_3$ | $Pb(C_2H_5)_4$ | 0 | 7 | |
| | | $Ti(i-OC_3H_7)_4$ | 30 | 4.5 | |
| 4 | $PbTiO_3$ | $Pb(C_2H_5)_4$ | 0 | 7 | |
| | | $Ti(i-OC_3H_7)_4$ | 30 | 4.5 | |
| 5 | $PbTiO_3$ | $Pb(C_2H_5)_4$ | 0 | 7 | alternatingly with $O_2$ |
| | | $Ti(i-OC_3H_7)_4$ | 30 | 4.5 | 5 hours |
| 6 | $PbTiO_3$ | $Pb(C_2H_5)_4$ | 0 | 7 | |

As has been described above, in accordance with the present invention, the orientation-grown paraelectric oxide thin film is formed on the Si substrate, followed by heating in the oxidizing atmosphere, thus forming the carrier injection inhibiting layer composed of silicon oxide between the Si substrate and the paraelectric oxide thin film. Formation of the highly oriented ferroelectric thin film via the paraelectric oxide thin film can prevent injection of carriers into the ferroelectric from the Si substrate, and further, enables the current flowing between the source and the drain to be turned on or off in a remarkably stable manner directly by spontaneous polarization of the ferroelectric. In comparison with FRAMs which have been recently developed, the nonvolatile memory can be provided in which film fatigue of the ferroelectric into the ferroelectric and enhancing gate characteristics. Consequently, the present invention can provide a nonvolatile memory having many advantages over the prior art.

As many widely different embodiments of this invention may be made without departing from the spirit and scope thereof, it is to be understood that the invention is not limited to the specific embodiments thereof except as defined in the appended claims.

As has been described above, in accordance with the present invention, the orientation-grown paraelectric oxide thin film is formed on the Si substrate, followed by heating in the oxidizing atmosphere, thus forming the carrier injection inhibiting layer composed of silicon oxide between the Si substrate and the paraelectric oxide thin film. Formation of the highly oriented ferroelectric thin film via the paraelectric oxide thin film can prevent injection of the carriers into the ferroelectric from the Si substrate, and further, enables a current flowing between the source and the drain to be turned on or off in a remarkably stable manner directly by spontaneous polarization of the ferroelectric. In comparison with FRAMs which have been recently developed, the nonvolatile memory can be provided in which film fatigue of the ferroelectric can be largely reduced since a reading operation does not involve inversion of spontaneous polarization and area reduction can be achieved because it is unnecessary to provide capacitors in regions other than the transistors. Furthermore, the carrier injection inhibiting layer made of the Si oxide film is formed on the interface by heat treatment after formation of the $CeO_2$ film, so as to attain interface control, which was difficult conventionally, thus inhibiting injection of the carriers from the substrate into the ferroelectric and enhancing gate characteristics. Consequently, the present invention can provide the nonvolatile memory having many advantages over the prior art.

As many widely different embodiments of this invention may be made without departing from the spirit and scope thereof, it is to be understood that the invention is not limited to the specific embodiments thereof except as defined in the appended claims.

What is claimed is:

1. A semiconductor storage device comprising:

an Si single crystal substrate;

a transistor formed on said Si single crystal substrate;

said transistor comprising a gate having a laminated structure comprising:

a carrier injection inhibiting layer made of an Si oxide film, an oriented paraelectric oxide thin film, an oriented ferroelectric thin film, and a conductor thin film sequentially laminated on said Si single crystal substrate.

2. The semiconductor storage device as claimed in claim 1, wherein said Si oxide film is from 20 to 100 Å thick.

3. The semiconductor storage device as claimed in claim 1, wherein said oriented paraelectric oxide thin film is an oriented thin film composed of at least one compound selected from the group consisting of $CeO_2$, YSZ (yttria-stabilizeed zirconia), ceria-stabilized zirconia, $Y_2O_3$, $ZrO_2$, MgO, $SrTiO_3$ and $MgAl_2O_4$.

4. The semiconductor storage device as claimed in claim 1, wherein said oriented ferroelectric thin film is an oriented thin film composed of at least one compound selected from the group consisting of $PbTiO_3$, $PbZrTiO_3$, $PbLaZrTiO_3$ and $SrBi_2Ta_2O_9$.

5. The semiconductor storage device as claimed in claim 1, wherein said Si single crystal substrate is a (100) Si single crystal substrate.

6. The semiconductor storage device as claimed in claim 1, wherein said Si single crystal substrate is a (111) Si single crystal substrate.

7. The semiconductor storage device as in claim 1, wherein said oriented paraelectric oxide thin film has crystallographic axes arranged acutely perpendicularly to a main surface of the substrate.

8. The semiconductor storage device as claimed in claim 2, wherein said oriented paraelectric oxide thin film is an oriented thin film composed of at least one compound selected from the group consisting of $CeO_2$, YSZ (yttria-stabilized zirconia), ceria-stabilized zirconia, $Y_2O_3$, $ZrO_2$, MgO, $SrTiO_3$ and $MgAl_2O_4$.

* * * * *